US012764863B2

(12) United States Patent
Kim et al.

(10) Patent No.: US 12,764,863 B2
(45) Date of Patent: Oct. 13, 2026

(54) CIRCUIT BOARD, MANUFACTURING METHOD THEREOF, AND ELECTRONIC COMPONENT PACKAGE INCLUDING THE SAME

(71) Applicant: SAMSUNG ELECTRO-MECHANICS CO., LTD., Suwon-si (KR)

(72) Inventors: Heasung Kim, Suwon-si (KR); Sanghoon Kim, Suwon-si (KR); Young Kuk Ko, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 247 days.

(21) Appl. No.: 18/382,321

(22) Filed: Oct. 20, 2023

(65) Prior Publication Data

US 2024/0196535 A1 Jun. 13, 2024

(30) Foreign Application Priority Data

Dec. 13, 2022 (KR) ........................ 10-2022-0173923

(51) Int. Cl.
*H05K 3/46* (2006.01)
*H05K 1/11* (2006.01)
(Continued)

(52) U.S. Cl.
CPC ............. *H05K 1/144* (2013.01); *H05K 1/111* (2013.01); *H05K 1/115* (2013.01); *H05K 1/181* (2013.01);
(Continued)

(58) Field of Classification Search
CPC ...... H05K 1/111; H05K 3/4644; H05K 1/185; H05K 3/4626; H05K 3/4697
See application file for complete search history.

(56) References Cited

U.S. PATENT DOCUMENTS 8,031,474 B2 * 10/2011 Ogawa ................... H05K 3/462 361/761
2012/0032337 A1 2/2012 Lu et al.
(Continued)

FOREIGN PATENT DOCUMENTS

JP 2017-162849 A 9/2017
KR 10-1333801 B1 11/2013
(Continued)

OTHER PUBLICATIONS

Office Action issued on Jan. 21, 2026 in Korean Patent Application No. 10-2022-0173923 with English translation.

*Primary Examiner* — Sherman Ng
(74) *Attorney, Agent, or Firm* — Morgan, Lewis & Bockius LLP

(57) ABSTRACT

A disclosed circuit board includes: an insulating layer; a contact layer disposed on a first surface of the insulating layer; a connecting layer including a connecting portion embedded in the insulating layer and disposed on the contact layer; a via penetrating the insulating layer and connected to the connecting layer; and a wiring layer disposed on a second surface of the insulating layer opposing the first surface and connected to the via. The connecting portion includes a first connecting layer portion disposed on the contact layer and a second connecting layer portion disposed on the first connecting layer portion. The insulating layer includes a first portion embedding the first connecting layer portion and surrounding the first connecting layer portion and a second portion embedding the second connecting layer portion. The insulating layer includes a cavity penetrating the second portion. The first portion has a smaller area than the second portion.

16 Claims, 16 Drawing Sheets

(51) Int. Cl.
*H05K 1/14* (2006.01)
*H05K 1/181* (2026.01)
*H05K 3/40* (2006.01)

(52) U.S. Cl.
CPC ......... *H05K 3/4007* (2013.01); *H05K 3/4644* (2013.01); *H05K 2201/042* (2013.01)

(56) References Cited

U.S. PATENT DOCUMENTS

| | | | | |
|---|---|---|---|---|
| 2013/0049198 | A1 | 2/2013 | Lia et al. | |
| 2015/0342046 | A1 | 11/2015 | Kim et al. | |
| 2016/0351545 | A1* | 12/2016 | Hong | H01L 23/49827 |
| 2017/0256470 | A1* | 9/2017 | Sakamoto | H01L 24/20 |
| 2017/0256478 | A1* | 9/2017 | Sakamoto | H01L 21/4857 |

FOREIGN PATENT DOCUMENTS

| | | | |
|---|---|---|---|
| KR | 10-2015-0135048 | A | 12/2015 |
| KR | 2015-0135048 | A | 12/2015 |
| KR | 10-1653563 | B1 | 8/2016 |
| KR | 10-2425753 | B1 | 7/2022 |

* cited by examiner

CIRCUIT BOARD, MANUFACTURING METHOD THEREOF, AND ELECTRONIC COMPONENT PACKAGE INCLUDING THE SAME

CROSS-REFERENCE TO RELATED APPLICATION

This application claims priority to and the benefit of Korean Patent Application No. 10-2022-0173923 filed in the Korean Intellectual Property Office on Dec. 13, 2022, the entire contents of which are incorporated herein by reference.

TECHNICAL FIELD

The present disclosure relates to a circuit board, a manufacturing method thereof, and an electronic component package including the same.

BACKGROUND

A circuit board is a circuit pattern made of a conductive material such as copper on an insulating material, and as electronic devices including mobile phones in the IT field are down-sized, a method of forming a cavity on a circuit board and mounting electronic components such as an IC, or active or passive devices in the cavity, has been proposed.

Depending on a depth of the cavity of the circuit board on which the electronic component is mounted, a height of a part mounted on the circuit board among the electronic components may also change.

As the depth of the cavity of the circuit board is increased, more parts of the electronic component can be mounted in the cavity, and the entire thickness of a product packaging the electronic component and the circuit board can be reduced.

However, as the depth of the cavity of the circuit board increases, the cavity structure may interrupt the flow of the mold injected between the electronic component and the circuit board, and the circuit board may be twisted due to a difference in area of the insulating material.

The above information disclosed in this Background section is only for enhancement of understanding of the background of the disclosure, and therefore it may contain information that does not form the prior art that is already known in this country to a person of ordinary skill in the art.

SUMMARY

Embodiments are to provide a circuit board that allows a mold injected between a circuit board and an electronic component to flow smoothly, a manufacturing method thereof, and an electronic component package including the same.

However, the problem to be solved by the embodiments of the present disclosure is not limited to the above-described problem and can be variously expanded in the range of technical ideas included in the present disclosure.

A circuit board according to an embodiment includes: an insulating layer; a contact layer that is disposed on a first surface of the insulating layer; a connecting layer that includes a connecting portion embedded in the insulating layer and disposed on the contact layer; a via layer that penetrates the insulating layer and is connected to the connecting layer; and a wiring layer that is disposed on a second surface of the insulating layer opposing the first surface and connected to the via layer. The connecting portion includes a first connecting layer portion disposed on the contact layer and a second connecting layer portion disposed on the first connecting layer portion, the insulating layer includes a first portion disposed to embed the first connecting layer portion and surround the first connecting layer portion and a second portion to embed the second connecting layer portion, the insulating layer includes a cavity penetrating the second portion, and the first portion has a smaller area than the second portion.

In a plan view of the circuit board, the second connecting layer portion may have an area different from an area of the first connecting layer portion.

The connecting layer may include a plurality of the connecting portions and the insulating layer may include a plurality of the first portions.

The first portions may be spaced apart from each other and disposed independently.

The contact layer may include a contact pad corresponding to the connecting portion.

In a plan view of the circuit board, the contact pad may have an area larger than that of the first connecting layer portion.

The circuit board may further include a solder resist layer including a solder resist disposed to surround the contact pad on the first surface of the insulating layer.

The contact pad may have a circular or quadrangular shape in a plan view of the circuit board.

The solder resist may have a circular or quadrangular loop shape.

The second connecting layer portion may contain a metal.

The via layer may be tapered in a direction towards the connecting layer.

An electronic component package according to an embodiment includes: a first circuit board; a second circuit board connected to the first circuit board; and an electronic component mounted on one surface of the second circuit board. The first circuit board includes: an insulating layer; a contact layer that is disposed on a first surface of the insulating layer; a connecting layer that includes a connecting portion embedded in the insulating layer and disposed on the contact layer; a via layer that penetrates the insulating layer and is connected to the connecting layer; and a wiring layer that is disposed on a second surface of the insulating layer opposing the first surface and connected to the via layer. The connecting portion includes a first connecting layer portion disposed on the contact layer and a second connecting layer portion disposed on the first connecting layer portion, the insulating layer includes a first portion disposed to embed the first connecting layer portion and surround the first connecting layer portion and a second portion to embed the second connecting layer portion, the insulating layer includes a cavity penetrating the second portion, and the first portion has a smaller area than the second portion.

The connecting layer may include a plurality of the connecting portions and the insulating layer may include a plurality of the first portions, and the first portions may be spaced apart from each other and disposed independently.

The electronic component package may further include an encapsulant that is disposed between the first circuit board and the second circuit board and covers at least a part of the electronic component, wherein the encapsulant may be disposed in at least a part of the cavity.

The contact layer may include a contact pad corresponding to the connecting portion.

The contact pad may have a circular or quadrangular shape in a plan view of the electronic component package.

A circuit board manufacturing method according to an embodiment includes: forming a first connecting layer portion and a first sacrificial layer; forming a second connecting layer portion on a first surface of the first connecting layer portion; forming a second sacrificial layer on the first sacrificial layer to have a smaller area than the first sacrificial layer; forming an insulating layer to embed the first connecting layer portion, the second connecting layer portion, the first sacrificial layer, and the second sacrificial layer; forming a via layer through the insulating layer to be connected to the second connecting layer portion; forming a contact layer on a second surface of the first connecting layer portion opposing the first surface; and removing the first sacrificial layer and the second sacrificial layer by etching the first sacrificial layer and the second sacrificial layer.

The forming the first connecting layer portion may include forming a plurality of first connecting layer portions to be spaced apart from each other and independently disposed, and the forming the second connecting layer portion may include forming a plurality of second connecting layer portions on the first surfaces of the plurality of first connecting layer portions.

The forming the contact layer may include forming a contact pad corresponding to the first connecting layer portion.

The circuit board manufacturing method may further include forming a solder resist layer having a solder resist formed thereon to surround the contact pad on one surface of the insulating layer.

The forming the contact pad may include forming the contact pad such that the contact pad has a circular or quadrangular planar shape.

According to the embodiments, a circuit board that can suppress twist of the circuit board, improve flow characteristics in injection of a mold between the circuit board and electronic components, and enables a plating process to be performed more easily, a manufacturing method thereof, and electronic component package including the same can be provided.

DETAILED DESCRIPTION OF THE EMBODIMENTS

Figure 1:
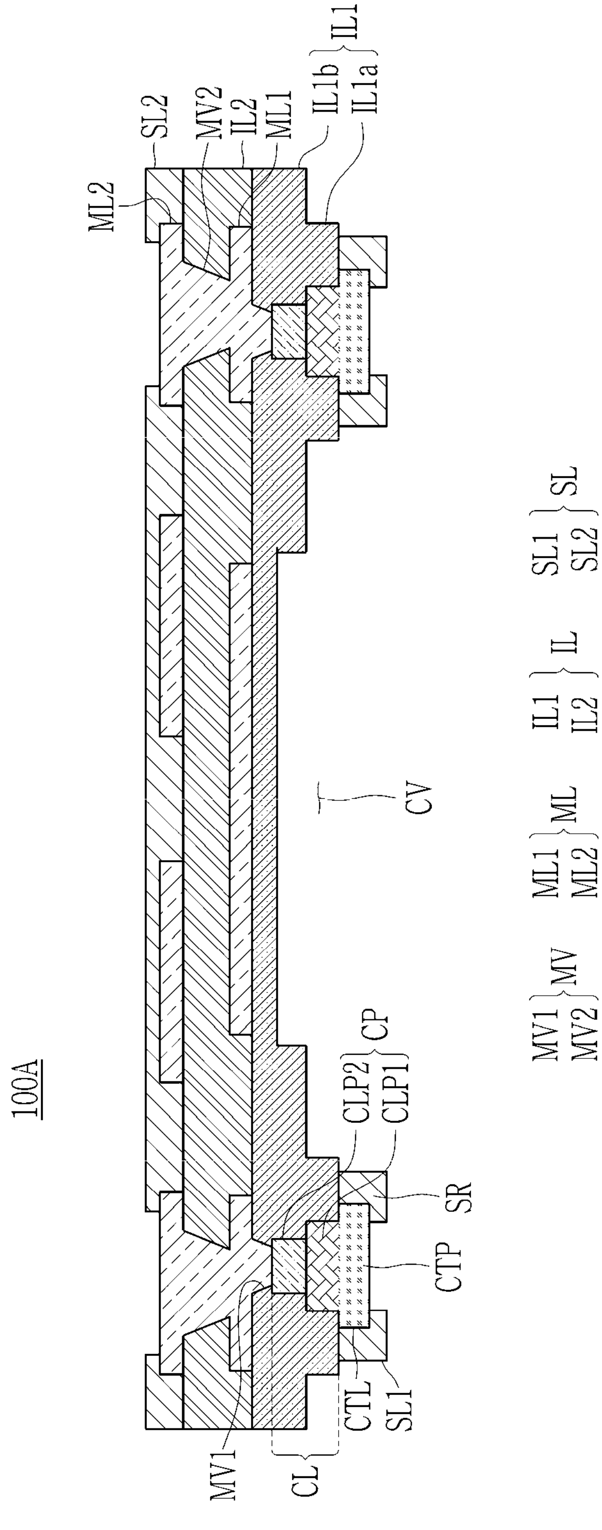
FIG. 1 is a cross-sectional view of a circuit board according to an embodiment.

Hereinafter, with reference to accompanying drawings, an embodiment of the present disclosure will be described in detail and thus a person of an ordinary skill can easily practice it in the technical field to which the present disclosure belongs. The drawings and description are to be regarded as illustrative in nature and not restrictive. Like reference numerals designate like elements throughout the specification. In addition, in the accompanying drawing, some constituent elements are exaggerated, omitted, or schematically shown, and the size of each constituent element does not fully reflect the actual size.

The accompanying drawing is only for easy understanding of the embodiment disclosed in this specification, and the technical idea disclosed in this specification is not limited by the accompanying drawing, and it should be understood that all changes and equivalents or substitutes included in the spirit and technical range of the present disclosure.

Terms containing ordinal numbers, such as first, second, and the like can be used to describe various configurations elements, but the constituent elements are not limited by the terms. The terms are used only for the purpose of distinguishing one constituent element from another.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

Throughout the specification, terms such as "comprise" or "have" are intended to designate that a feature, number, step, operation, constituent element, part, or combination thereof described in the specification exists, and it should be understood as not precluding the possibility of the presence or addition of and one or more other features, numbers, steps, actions, constituent elements, parts, or combinations thereof. In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Throughout the specification, "connected" does not mean only when two or more constituent elements are directly connected, but also when two or more constituent elements are indirectly connected through another constituent element, or when physically connected or electrically connected, and it may include a case in which substantially integral parts are connected to each other although they are referred to by different names according to positions or functions.

Hereinafter, various embodiments and variations are described in detail with reference to drawings.

Figure 2:
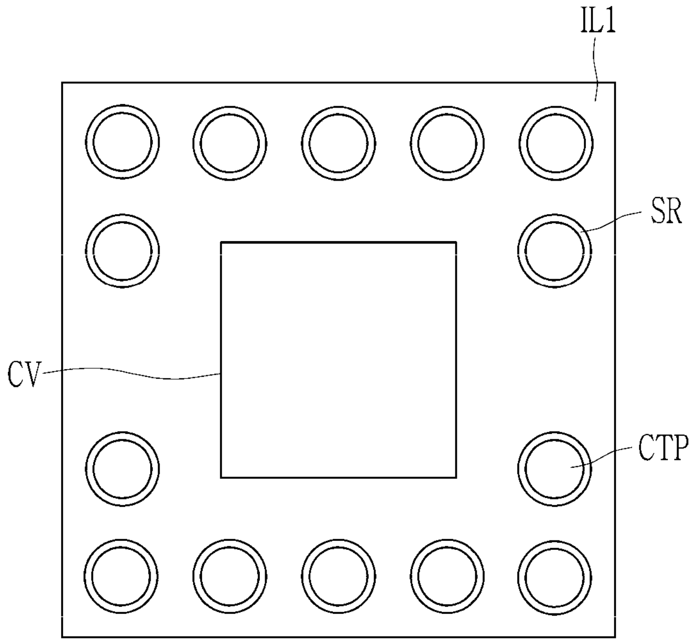
FIG. 2 is a schematic top plan view of one side of the circuit board of FIG. 1.

Referring to FIG. 1 and FIG. 2, a circuit board according to an embodiment will be described. FIG. 1 is a cross-sectional view of a circuit board according to an embodiment, and FIG. 2 is a schematic top plan view of one side of the circuit board of FIG. 1.

Referring to FIG. 1, a circuit board 100A according to the present embodiment may include a plurality of insulating layers IL, a plurality of wiring layers ML embedded in the plurality of insulating layers IL, a plurality of via layers MV disposed in the plurality of insulating layers IL, a connecting layer CL embedded in a portion of the plurality of insulating layers IL disposed within the plurality of insulating layers IL, a cavity CV disposed on a portion of the plurality of insulating layers IL, a contact layer CTL, and a plurality of solder resist layers SL.

The circuit board 100A according to the present embodiment may be an interposer board connected to an electronic component later, but is not necessarily limited thereto.

The plurality of insulating layers IL may include a first insulating layer IL1 and a second insulating layer IL2 disposed on the first insulating layer IL1. An insulating material may be used as a material for each of the plurality of insulating layers IL, and the insulating material may include a thermosetting resin such as an epoxy resin, a thermoplastic resin such as a polyimide, or an inorganic filler such as silica, and a reinforcing member such as glass fiber in these resins. For example, a prepreg may be used as a material for each of the plurality of insulating layers IL, but is not limited thereto, and a material that does not include a reinforcing member such as glass fiber, for example, an Ajinomoto-build up film (ABF) or the like, may be used. If necessary, a photosensitive insulating material such as photoimageable dielectric (PID) may be used as a material for each of the plurality of insulating layers IL.

The cavity CV may be disposed on a first surface of the first insulating layer IL1. The cavity CV may be formed through an etching process. In addition, when the circuit board 100A is an interposer board and is connected to a board of an electronic component later, a sealing material (400; refer to FIG. 12 and FIG. 13) may be disposed inside the cavity CV. Referring to FIG. 1, the plurality of insulating layers IL are shown to include the first and second insulating layers IL1 and IL2, but are not limited thereto, and the plurality of insulating layers IL may include more layers than shown or may include fewer layers.

The plurality of wiring layers ML may include a first wiring layer ML1 disposed on a second surface that faces the first surface of the first insulating layer IL1, and a second wiring layer ML2 disposed on one surface of the second insulating layer IL2. The first wiring layer ML1 may be embedded in the second insulating layer IL2. Each of the plurality of wiring layers ML may transmit a signal of the circuit board.

A metal material may be used as a material for each of the plurality of wiring layers ML. The metal material may include copper (Cu), aluminum (Al), silver (Ag), tin (Sn), gold (Au), nickel (Ni), lead (Pb), titanium (Ti), or alloys thereof. Each of the plurality of wiring layers ML may perform various functions according to a design such as a ground pattern, a power pattern, and a signal pattern. Each of these patterns may have a line shape, a plane shape, or a pad shape. In the case of a wiring layer positioned at the outermost layer among a plurality of wiring layers ML, it may function as a pad for connection with other substrates or components. For example, the second wiring layer ML2 positioned on the outermost layer of the circuit board may function as a pad for connection with other boards or components.

Referring to FIG. 1, only the first and second wiring layers ML1 and ML2 are shown, but the present disclosure is not limited thereto, and more wiring layers than shown may be disposed, and fewer wiring layers may be disposed.

The plurality of via layers MV may include a first via layer MV1 disposed within the first insulating layer IL1 and a second via layer MV2 disposed within the second insulating layer IL2.

The first via layer MV1 may pass through the first insulating layer IL1 and be connected to the connecting layer CL and the first wiring layer ML1. The first via layer MV1 may electrically connect the connecting layer CL and the first wiring layer ML1.

The second via layer MV2 may pass through the second insulating layer IL2 and be connected to the first wiring layer ML1 and the second wiring layer ML2. The second via layer MV2 may electrically connect the first wiring layer ML1 and the second wiring layer ML2.

A metal material may be used as a material for each of the plurality of via layers MV. The metal material may include copper (Cu), aluminum (Al), silver (Ag), tin (Sn), gold (Au), nickel (Ni), lead (Pb), titanium (Ti), or alloys thereof. Each of the plurality of via layers MV may include a signal via, a ground via, a power via, and the like depending on designs. In each via of the plurality of via layers MV, each via hole may be completely filled with a metal material, or a metal material may be formed along a wall surface of the via hole. Each of the plurality of via layers MV may be formed through a plating process, such as an additive process (AP), a semi-AP (SAP) process, a modified SAP (MSAP) process, or a tenting (TT) process. Each of the plurality of via layers MV may include a seed layer, which is an electroless plating layer, and an electroplating layer formed based on the seed layer. Each via of the plurality of via layers MV may have a tapered shape in which a width of a top surface is greater than a width of a bottom surface.

Referring to FIG. 1, only the first and second via layers MV1 and MV2 are shown, but the present disclosure is not limited thereto, and more or fewer via layers may be disposed as needed.

The contact layer CTL may be disposed on the first surface of the first insulating layer IL1. The contact layer CTL may include a contact pad CTP having conductivity corresponding to the connecting portion CP. The contact pad CTP may be formed through a plating process. Referring to FIG. 2, each of the contact pads CTP may have a circular planar shape.

Each of the plurality of solder resist layers SL may be disposed on a portion of the plurality of insulating layer IL to cover a portion of the contact pad CTP or the plurality of wiring layers ML to prevent unnecessary short circuits. Each of the plurality of solder resist layers SL may include a photosensitive resin material.

The first solder resist layer SL1 may be disposed on the first surface of the first insulating layer IL1. The first solder resist layer SL1 may be disposed to expose a part of the contact pad CTP. The first solder resist layer SL1 may include a solder resist SR. The solder resist SR may be disposed on the first surface of the first insulating layer IL1 to surround the contact pad CTP. Referring to FIG. 2, the solder resist SR may have a circular loop shape surrounding the contact pad CTP.

The second solder resist layer SL2 may be disposed on the second insulating layer IL2. The second solder resist layer SL2 may be disposed to expose a portion of the second wiring layer ML2.

The connecting layer CL may be embedded in the first insulating layer IL1. The connecting layer CL may include a connecting portion CP positioned on the contact layer CTL. The connecting portion CP may include a first connecting layer portion CLP1 disposed on the contact layer CTL and a second connecting layer portion CLP2 disposed on the first connecting layer portion CLP1. The first connecting layer portion CLP1 and the second connecting layer portion CLP2 may have different flat areas. For example, the first connecting layer portion CLP1 may have a larger flat area than the second connecting layer portion CLP2. The contact pad CTP may be disposed on the first connecting layer portion CLP1 and may have a larger flat area than the first connecting layer portion CLP1. The first connecting layer portion CLP1 and the second connecting layer portion CLP2 may include a metal.

The first insulating layer IL1 may include a first portion IL1*a* filling the first connecting layer portion CLP1 and a second portion IL1*b* filling the second connecting layer portion CLP2. The cavity CV may be formed in a stepped groove shape on one surface of the first portion IL1*a* and one surface of the second portion IL1*b*. In addition, the cavity CV may have a rectangular planar shape. The first portion IL1*a* may be disposed to surround the first connecting layer portion CLP1, and may be independently disposed on the second portion IL1*b* while being spaced apart from each other. Specifically, the first portion IL1*a* may be independently disposed on the second portion IL1*b* along the circumference of the cavity CV while being spaced apart from each other. Also, the first portion IL1*a* may have a smaller flat area than the second portion IL1*b*.

Referring to FIG. 2, the connecting layer CL may include a plurality of connecting portions CP, and a plurality of contact pads CTP may be disposed corresponding to each of the plurality of connecting portions CP. In addition, the solder resist SR may be disposed on the first surface of the first insulating layer IL1 to surround each of the plurality of contact pads CTP. The plurality of connecting portions CP may be spaced apart from each other and independently disposed, and the first portion IL1*a* surrounding each of the plurality of first connecting layer portions CLP1 may also be spaced apart from each other and independently disposed.

In the circuit board according to the present embodiment, although a depth of the cavity formed on the circuit board increases, the insulating material and the solder resist may be formed only in an area adjacent to a protruded contact pad, and thus bending of the circuit board can be suppressed, and it is possible to improve the flow characteristics in injection of a mold between a mold and electronic parts.

Figure 3:
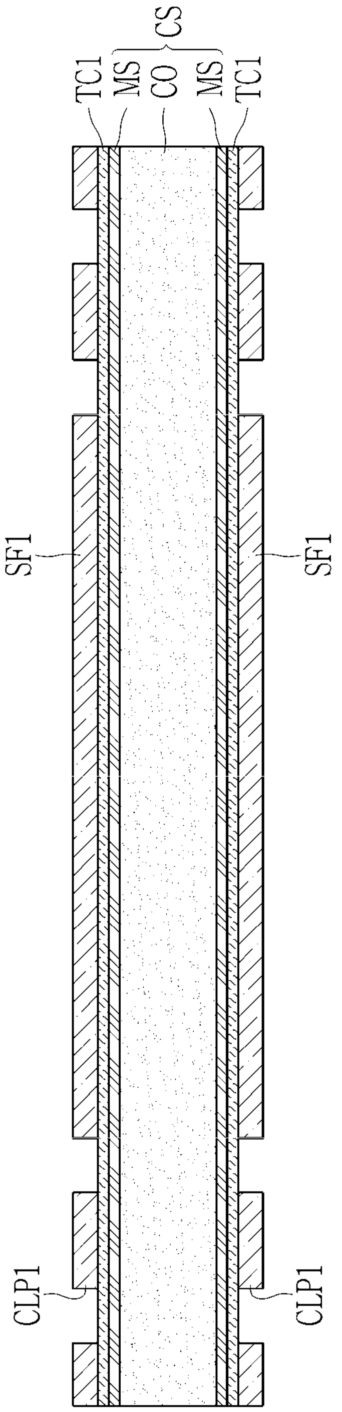
FIG. 3 is a cross-sectional view of a manufacturing method of a circuit board according to an embodiment.

Hereinafter, referring to FIG. 3 to FIG. 11, a manufacturing method of a circuit board according to an embodiment will be described. FIG. 3, FIG. 5, and FIG. 7 to FIG. 11 are cross-sectional views of a manufacturing method of a circuit board according to an embodiment, FIG. 4 is a schematic top plan view of one side of the circuit board of FIG. 3, and FIG. 6 is a schematic top plan view of one side of the circuit board of FIG. 5.

Referring to FIG. 3, a first copper foil layer TC1 and a first connecting layer portion CLP1 may be formed on a carrier substrate CS including a core portion CO and a thin metal layer MS stacked on both sides of the core portion CO. Here, a first sacrificial layer SF1 disposed at a position where the cavity CV is to be formed may be formed together therewith. Since the first sacrificial layer SF1 is formed together with the first connecting layer portion CLP1, it may be made of the same material as the first connecting layer portion CLP1 and have the same thickness as the first connecting layer portion CLP1.

Figure 4:
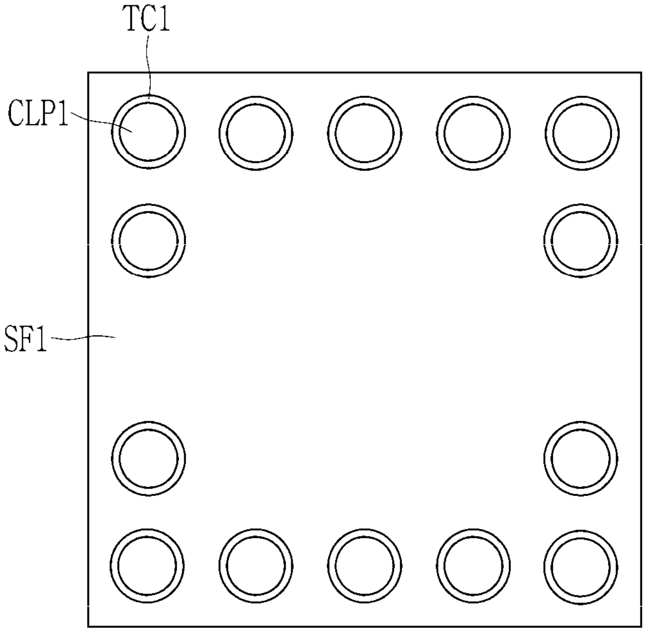
FIG. 4 a schematic top plan view of one side of the circuit board of FIG. 3.

Referring to FIG. 4, a plurality of first connecting layer portions CLP1 may be formed to be independently disposed on the first copper foil layer TC1 while being spaced apart from each other. The first connecting layer portion CLP1 may have a circular planar shape. The first sacrificial layer SF1 may be formed on the first copper foil layer TC1 to be spaced apart from the first connecting layer portion CLP1. The first sacrificial layer SF1 may be formed to be spaced apart from the first connecting layer portion CLP1 and surround the first connecting layer portion CLP1. That is, the first sacrificial layer SF1 may be integrally formed while being spaced apart from and surrounding the first connecting layer portion CLP1.

Figure 5:
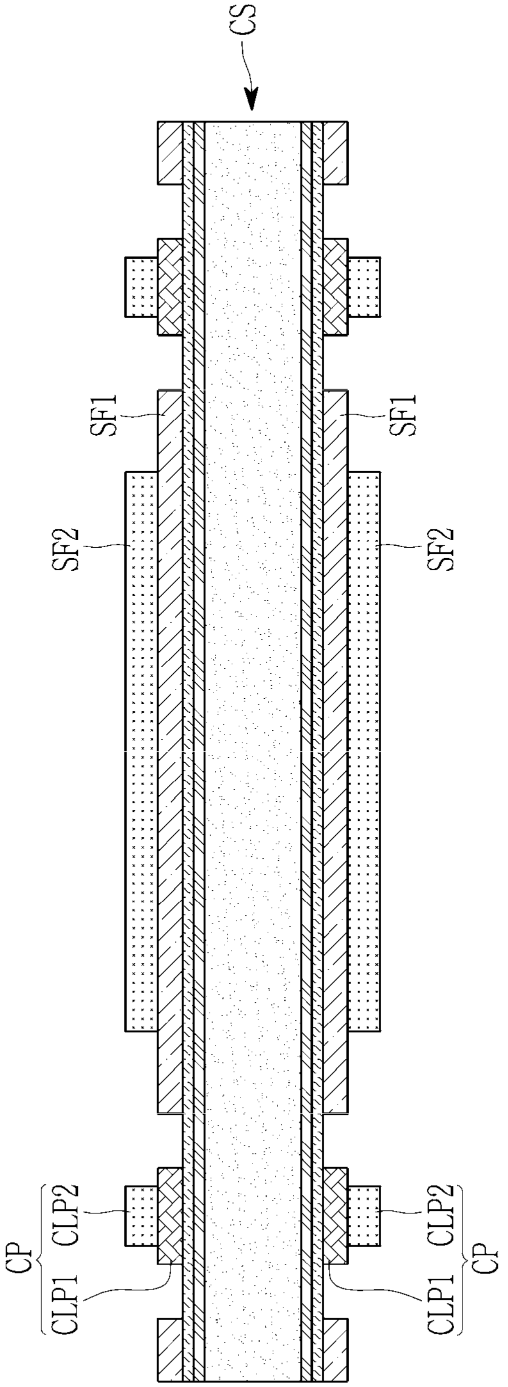
FIG. 5 is a cross-sectional view of a manufacturing method of a circuit board according to an embodiment.
Figure 6:
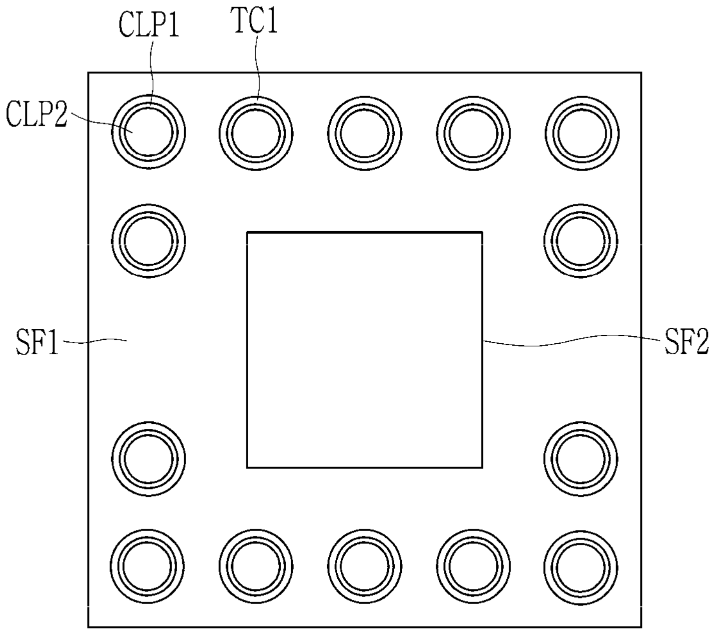
FIG. 6 is a schematic top plan view of one side of the circuit board of FIG. 5.

Referring to FIG. 5, the second connecting layer portion CLP2 may be formed on a first surface of the first connecting layer portion CLP1. Accordingly, the connecting portion CP including the first connecting layer portion CLP1 and the second connecting layer portion CLP2 may be formed. Here, the second sacrificial layer SF2 disposed at a position where the cavity CV is to be formed may be formed together therewith. The second sacrificial layer SF2 may be formed on the first sacrificial layer SF1. In addition, the second sacrificial layer SF2 may be formed to have a smaller area than the first sacrificial layer SF1. Since the second sacrificial layer SF2 is formed together with the second connecting layer portion CLP2, it may be made of the same material as the second connecting layer portion CLP2 and have the same thickness as the second connecting layer portion CLP2.

Referring to FIG. 6, a plurality of second connecting layer portions CLP2 may be formed on the first surfaces of the plurality of first connecting layer portions CLP1. The plurality of second connecting layer portions CLP2 may be spaced apart from each other and independently disposed on the first connecting layer portions CLP1, and thus the connecting portions CP can be spaced apart from each other and independently disposed on the first copper layer TC1. The second connecting layer portion CLP2 may have a circular planar shape. The second sacrificial layer SF2 may be formed on the first sacrificial layer SF1. The second sacrificial layer SF2 may be formed to have a planar shape disposed in regions surrounded by the plurality of first connecting layer portions CLP1. Accordingly, the plurality of second connecting layer portions CLP2 may also be disposed to surround the second sacrificial layers SF2.

Figure 7:
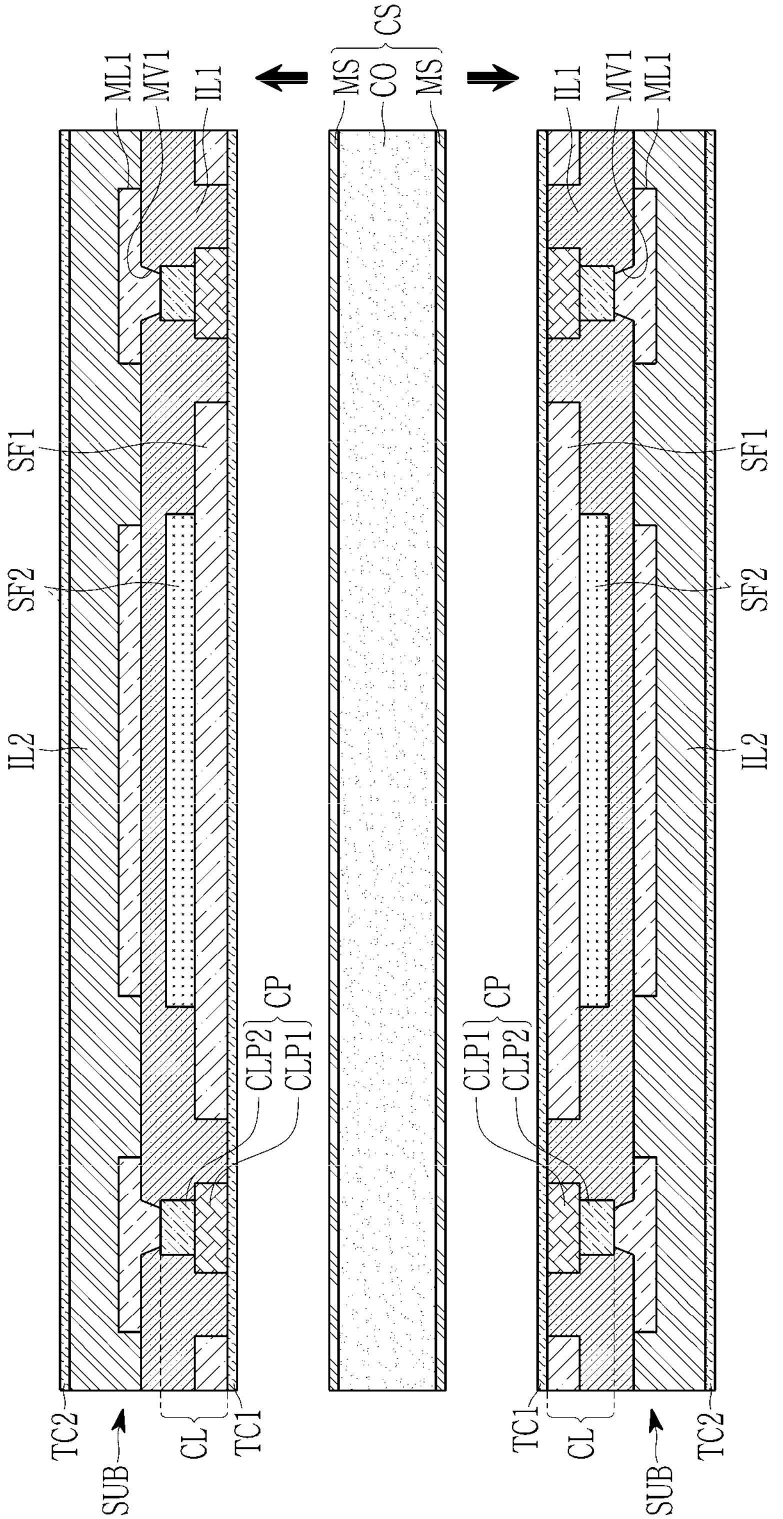
FIG. 7 to FIG. 11 are cross-sectional views of a manufacturing method of a circuit board according to an embodiment.

Referring to FIG. 7, a first insulating layer IL1 may be formed on contact layers CL including a connecting portion CP and first and second sacrificial layers SF1 and SF2. The first and second connecting layer portions CLP1 and CLP2 and the first and second sacrificial layers SF1 and SF2 may be embedded in the first insulating layer IL1. A first via layer MV1 may be formed to pass through the first insulating layer IL1 so as to be connected to the second connecting layer portion CLP2. A first wiring layer ML1 may be formed on the first insulating layer IL1. The second insulating layer IL2 may be formed to embed the first wiring layer ML1 on the first insulating layer IL1. A second copper foil layer TC2 may be formed on the second insulating layer IL2. Next, a substrate portion SUB may be separated from both sides of the carrier substrate CS.

Hereinafter, one substrate portion SUB separated from the carrier substrate CS will be described.

Figure 8:
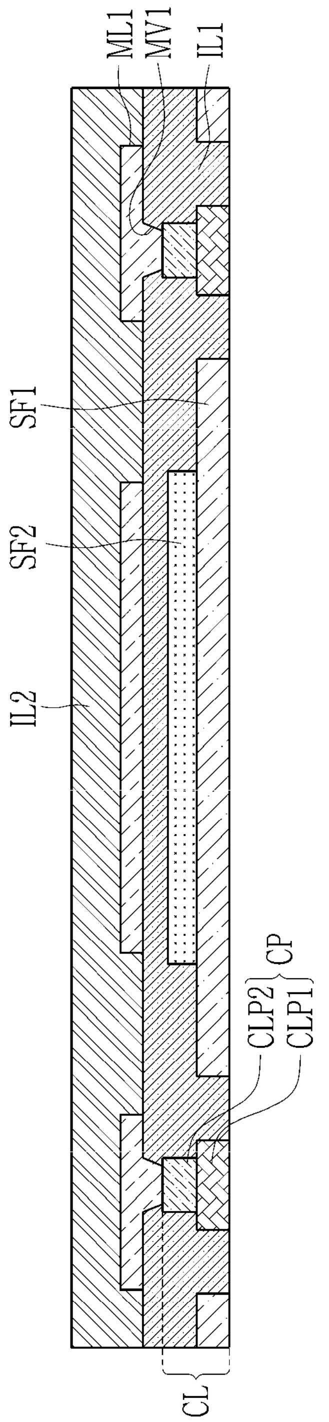

As shown in FIG. 8, the first and second copper foil layers TC1 and TC2 may be removed from the substrate portion SUB.

Figure 9:
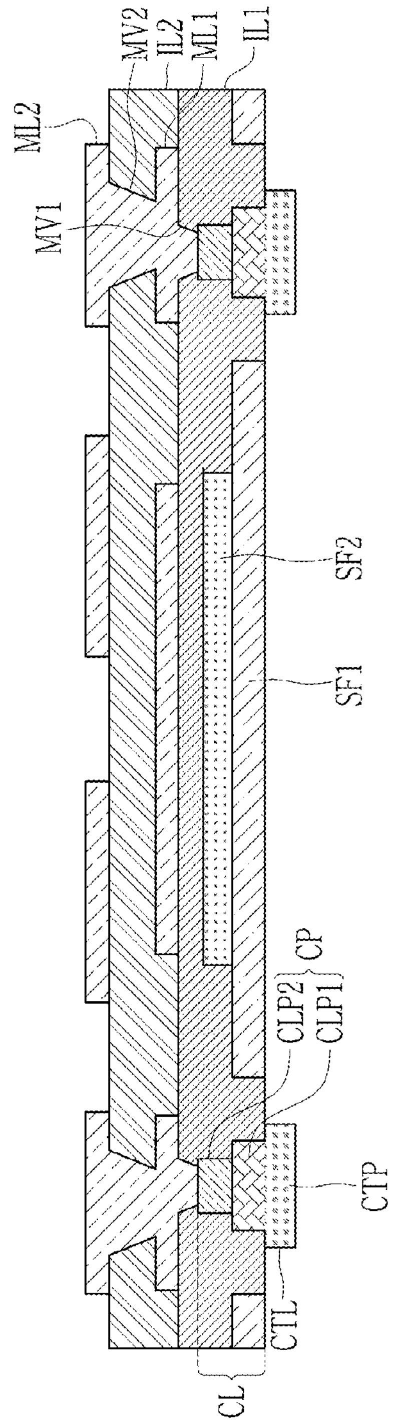

Referring to FIG. 9, a second via layer MV2 may be formed by forming a via on the second insulating layer IL2, and a second wiring layer ML2 may be formed on the second insulating layer IL2. The second wiring layer ML2 may be electrically connected to the first wiring layer ML1 through vias formed in the second via layer MV2. In addition, a contact layer CTL may be formed on a second surface facing the first surface of the first connecting layer portion CLP1. A contact pad CTP corresponding to the first connecting layer portion CLP1 may be formed on the contact layer CTL. The contact pad CTP may be formed to have a circular shape. In addition, the contact pad CTP may be formed in a region corresponding to the first connecting layer portion CLP1 through a plating process. Therefore, the plating area is increased during substrate manufacturing such that the plating process can be performed more easily.

Figure 10:
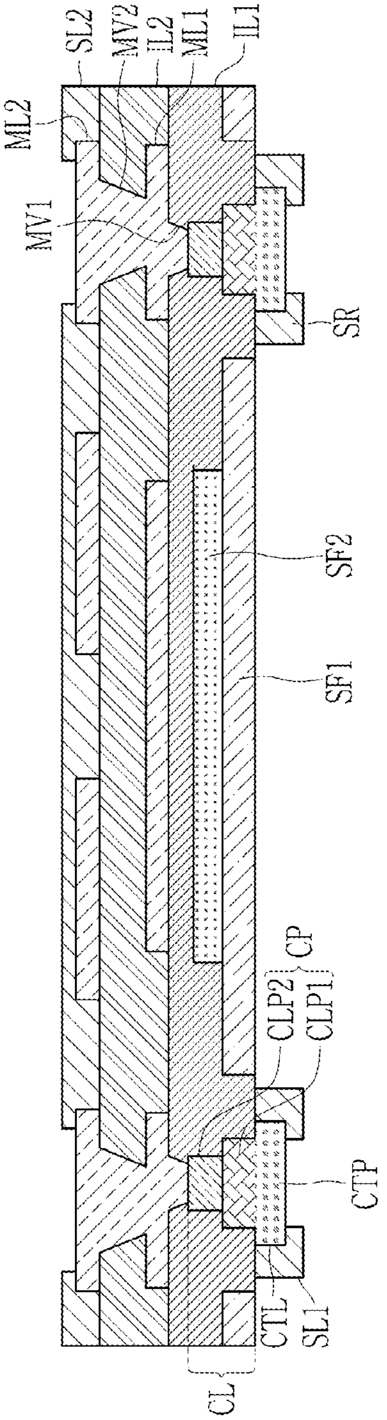

Referring to FIG. 10, a first solder resist layer SL1 may be formed on one surface of the first insulating layer IL1. The first solder resist layer SL1 may expose a part of the contact layer CTL. A solder resist SR may be formed on the first solder resist layer SL1 to surround the contact pad CTP. The solder resist SR may partially cover an edge of the contact pad CTP, and therefore, the exposed flat area of the contact pad CTP may be smaller than the flat area of the contact pad CTP. The solder resist SR may be formed on the first portion IL1*a* of the first insulating layer IL1 to have a smaller flat area than that of the first portion IL1*a*. In addition, the solder resist SR may be patterned to have a circular loop shape. The second solder resist layer SL2 may be formed on the second insulating layer IL2 and may expose a portion of the second wiring layer ML2.

Figure 11:
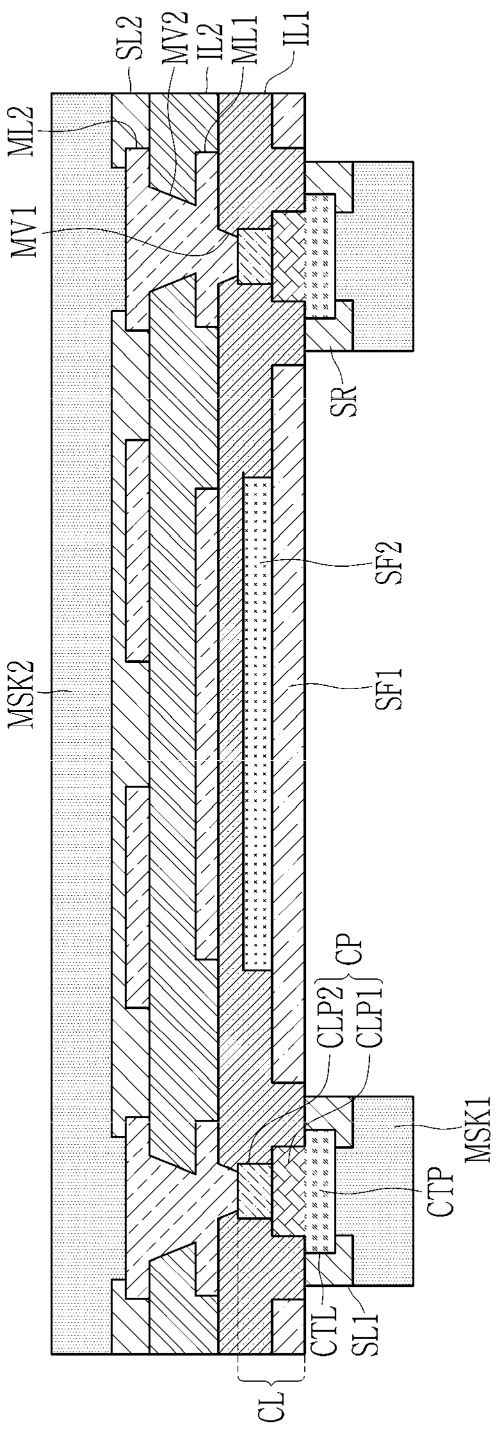

Referring to FIG. 11, a first mask layer MSK1 may be disposed on the first solder resist layer SL1, and a second mask layer MSK2 may be disposed on the second solder resist layer SL2. Except for the region where the cavity CV is to be formed, all parts may be covered by the first mask layer MSK1 and the second mask layer MSK2.

The first sacrificial layer SF1 and the second sacrificial layer SF2 disposed in the region where the cavity CV is to be formed may be etched and removed using the first mask layer MSK1 and the second mask layer MSK2 as etching masks. Accordingly, the cavity CV having a stepped groove shape may be formed on one surface of the first insulating layer IL1. After that, the first mask layer MSK1 and the second mask layer MSK2 are removed, and a circuit board as shown in FIG. 1 can be formed.

Hereinafter, referring to FIG. 12 and FIG. 13, an electronic component package according to an embodiment will be described.

Figure 12:
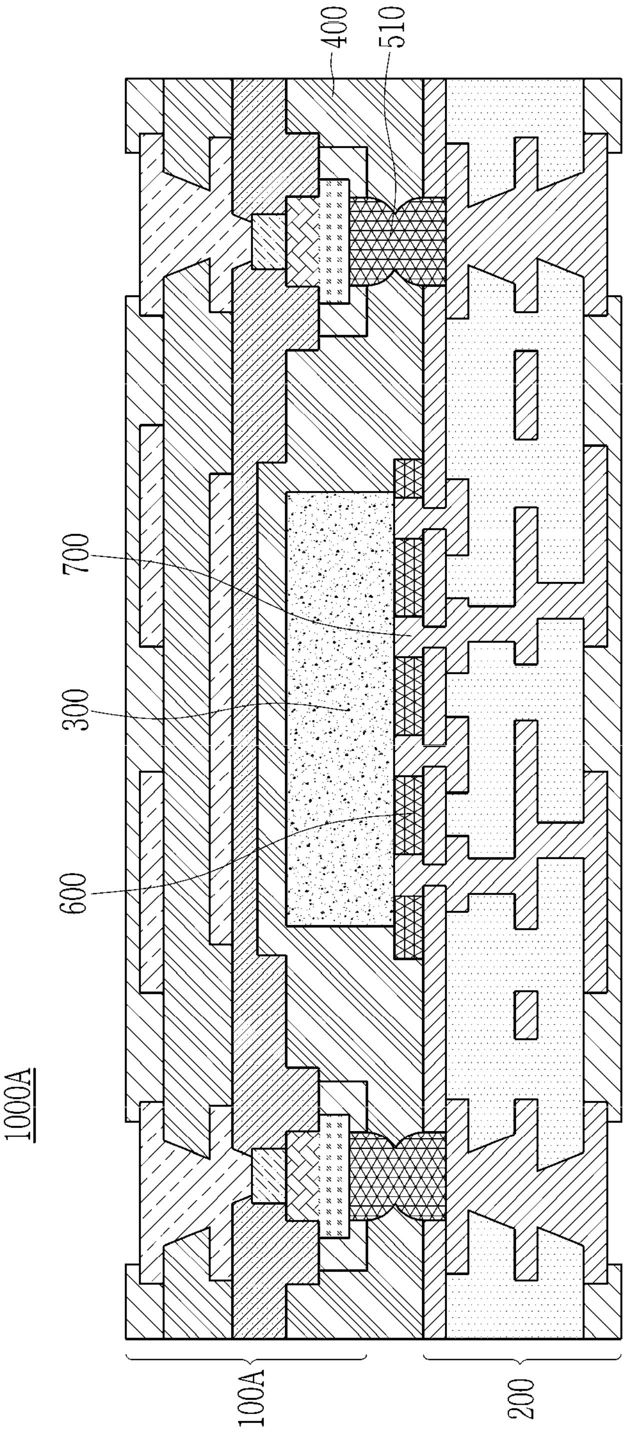
FIG. 12 is a schematic cross-sectional view of an electronic component package according to an embodiment.

FIG. 12 is a schematic cross-sectional view of an electronic component package according to an embodiment. FIG. 13 is a schematic cross-sectional view of an electronic component package according to another embodiment.

Referring to FIG. 12, an electronic component package 1000A according to the present embodiment may include the circuit board 100A according to the above-described embodiment. Hereinafter, the description of the first circuit board 100A may be equally applied to the description of the circuit board 100A according to the above-described embodiment.

The electronic component package 1000A according to an embodiment may include a first circuit board 100A, a second circuit board 200 connected to the first circuit board 100A, an electronic component 300 mounted on one surface of the second circuit board 200, an encapsulant 400 disposed between the first circuit board 100A and the second circuit board 200 to fill a cavity CV and to cover at least a part of the electronic component 300, a conductivity member 510 electrically connecting the first circuit board 100A and the second circuit board 200, an electrode that electrically connects the second circuit board 200 and the electronic component 300, and an underfill 600.

The second circuit board 200 is a circuit board on which the electronic component 300 is mounted, and may include an insulating layer, a wiring layer, a via layer, and a solder resist layer.

The electronic component 300 may be an integrated circuit (IC) die in which hundreds to millions of devices or more are integrated into a single chip. For example, the electronic component 300 is a processor chip such as a central processor (e.g., CPU), a graphics processor (e.g., GPU), a field programmable gate array (FPGA), a digital signal processor, a cryptographic processor, a microprocessor, and a microcontroller, and specifically, it may be an application processor (AP), but is not limited thereto. In addition, it may be memory such as a volatile memory (e.g., DRAM), a non-volatile memory (e.g., ROM), a flash memory, an analog-digital converter, or a logic such as an application-specific IC (ASIC). If necessary, the electronic component 300 may be a chip-type passive component, for example, a chip-type capacitor such as a multi-layer ceramic capacitor (MLCC), a chip-type inductor such as a power inductor (PI), and the like. The electronic component 300 may be covered by the encapsulant 400, and at least one surface may be in physical contact with the encapsulant 400.

The encapsulant 400 may be disposed on one surface of the first insulating layer IL1 to cover at least a portion of one surface of the first insulating layer IL1, one surface of the second circuit board 200, and an outer surface of the electronic component 300. In addition, the encapsulant 400 may fill at least a part of the cavity CV, and may cover at least a part of an upper surface of the electronic component 300. For example, the encapsulant 400 may physically contact at least a portion of each of the top, bottom, and side surfaces of the electronic component 300. Since the encapsulant 400 has fluidity in a state before hardening, it flows along the outer surface of the electronic component 300 and the surface of the first insulating layer IL1 to fill the inside of the cavity CV. In this case, although a depth of the cavity CV increases, an insulating material and the solder resist may be formed only in a region adjacent to a protruded contact pad CTP, such as the first portion IL1*a* of the first insulating layer IL1 and the first solder resist layer SL1. Therefore, it is possible to suppress the twist of the circuit board and improve the flow characteristic in injection of a mold between the circuit board and the electronic component.

The insulating material may be used as a material of the encapsulant 400, and a thermosetting resin such as an epoxy resin or a thermoplastic resin such as a polyimide may be used as the insulating material. In addition, those resins may contain inorganic fillers such as silica. For example, an Ajinomoto build-up film (ABF) may be used as a material for the encapsulant 400. The ABF may be provided in a resin-coated copper (RCC) form, but is not limited thereto. If necessary, a photosensitive material such as a photoimageable dielectric (PIE) may be used. In addition, the encapsulant 400 may be a known epoxy molding compound (EMC), but is not limited thereto.

The conductivity member 510 may be disposed in at least a part of an opening of the second circuit board 200. The conductivity member 510 may physically and/or electrically connect the second circuit board 200 with the outside. For example, the conductivity member 510 may electrically connect an exposed wiring layer of the second circuit board 200 and the contact pad CTP of the contact layer CTL. The conductivity member 510 may be formed of tin (Sn) or an alloy containing tin (Sn), for example, solder, but is not limited thereto. For example, the conductivity member 510 may have a pillar shape in which a plurality of balls are combined, but is not limited thereto, and may be a metal post of a land, a ball, a pin, or a pillar shape.

The underfill 600 is a material filled between the electronic component 300 mounted on the cavity CV of the second circuit board 200 and the second circuit board 200, and may fix the electronic component 300 in the cavity CV. In particular, when a gap is generated between one surface of the electronic component 300 and the second circuit board 200 due to protrusion formation of the electrode 700, the underfill 600 may be charged in the gap. The electronic component 300 may be fixed by the underfill 600.

Figure 13:
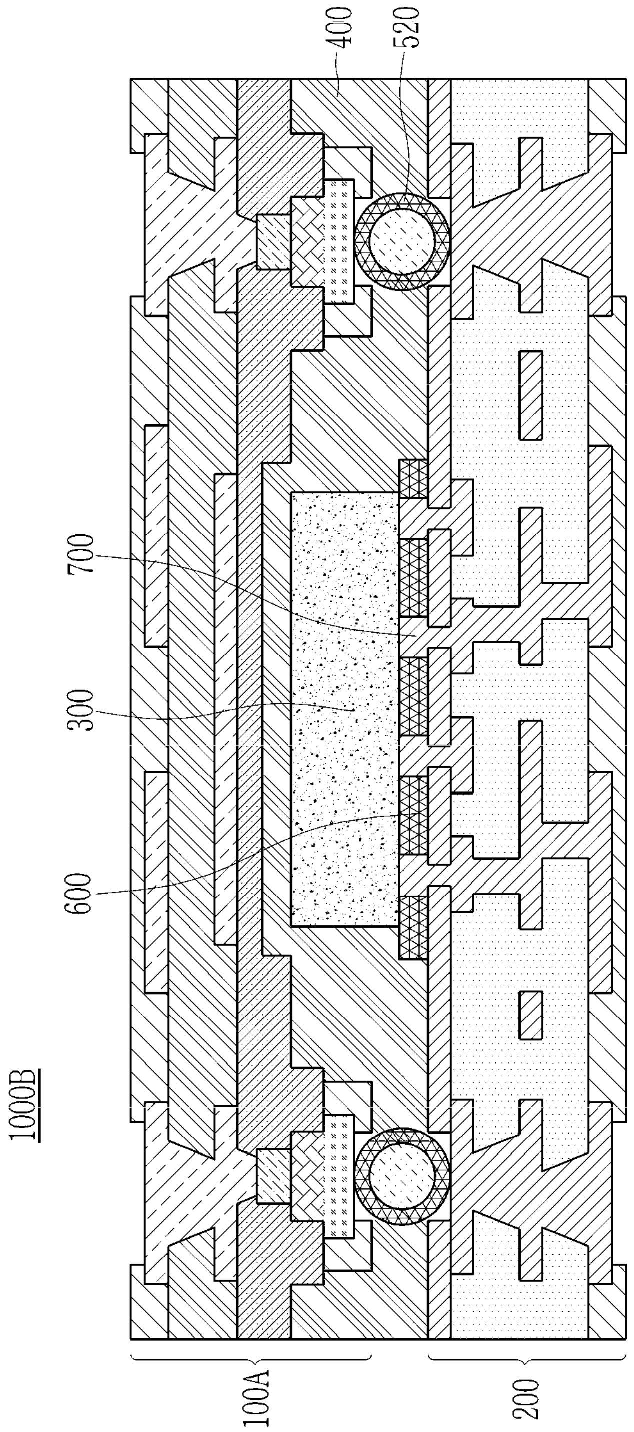
FIG. 13 is a schematic cross-sectional view of an electronic component package according to another embodiment.

Referring to FIG. 13, an electronic component package 1000B according to another embodiment may be different from the electronic component package 1000A according to the embodiment referring to FIG. 12 in the shape of the conductivity member 520.

A conductivity member 520 may be disposed at at least a part of an opening of the second circuit board 200. The conductivity member 520 may physically and/or electrically connect the second circuit board 200 with the outside. For example, the conductivity member 520 may electrically connect an exposed wiring layer of the second circuit board 200 and the contact pad CTP of the contact layer CTL. The conductivity member 520 may be formed of tin (Sn) or an alloy containing tin (Sn), for example, solder, but is not limited thereto. For example, the conductivity member 520 may be formed of a Cu core ball (CCB), but is not limited thereto, and may be a metal post of a land, a ball, a pin, or a pillar shape.

Figure 14:
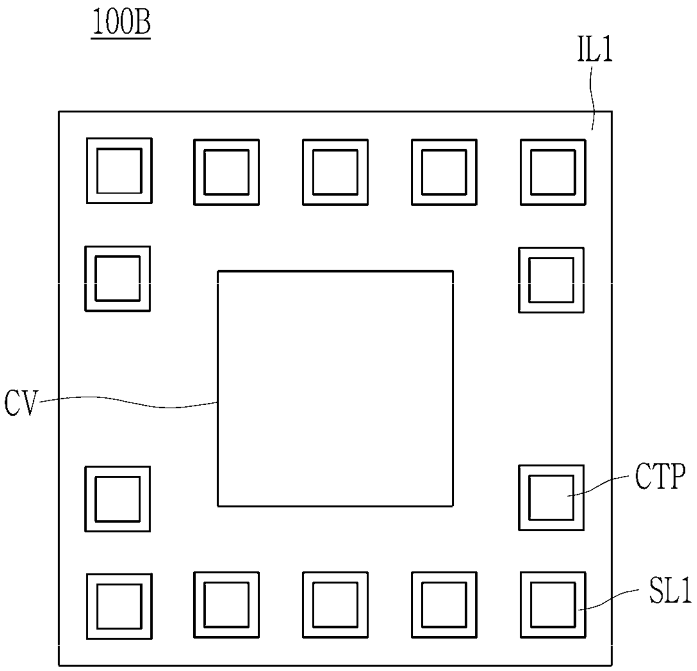
FIG. 14 is a schematic top plan view of one surface of a circuit board according to another embodiment.
Figure 15:
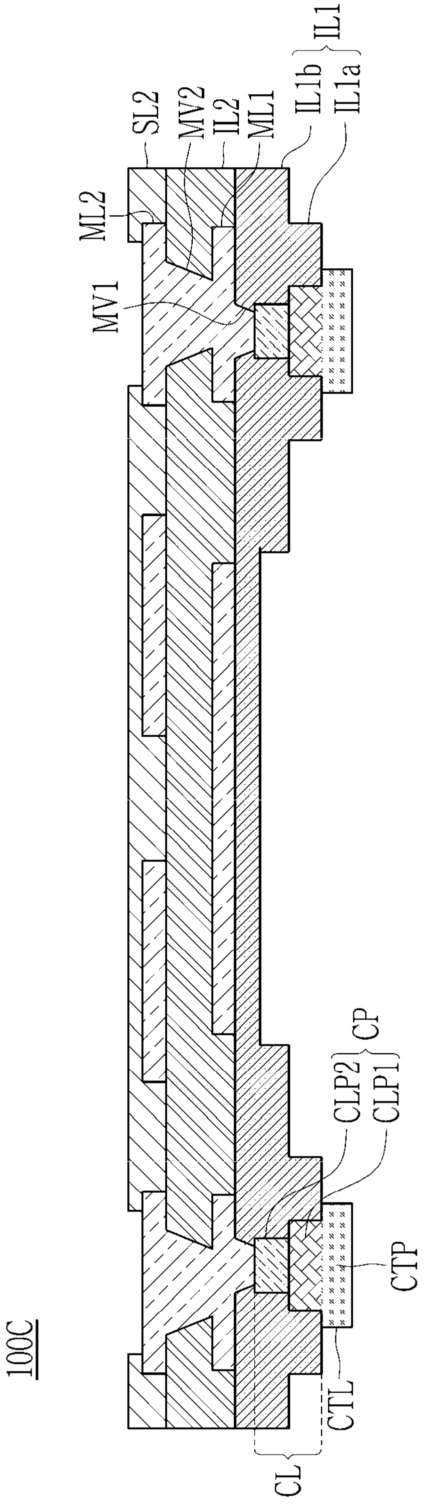
FIG. 15 is a cross-sectional view of a circuit board of another embodiment.
Figure 16:
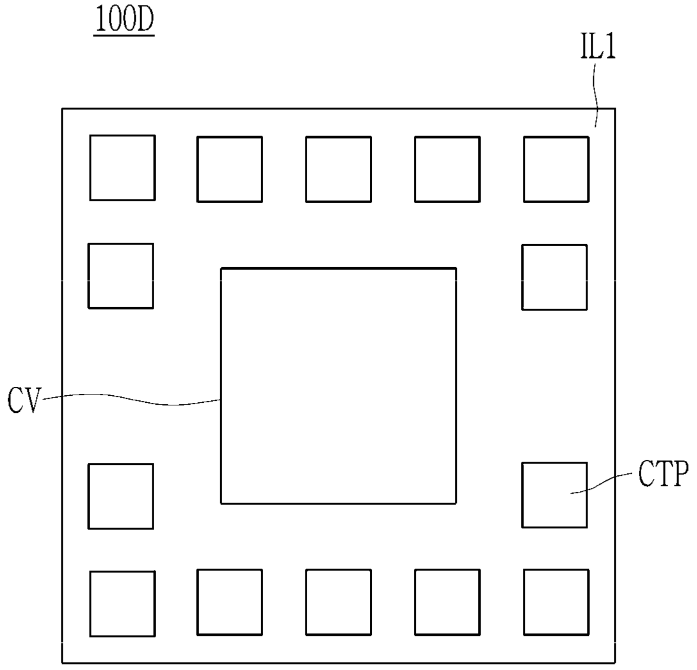
FIG. 16 is a schematic top plan view of one surface of a circuit board according to another embodiment.

FIG. 14 to FIG. 16 are provided to describe circuit boards according to various embodiments. FIG. 14 is a schematic top plan view of one surface of a circuit board according to another embodiment, FIG. 15 is a cross-sectional view of a circuit board of another embodiment, and FIG. 16 is a schematic top plan view of one surface of a circuit board according to another embodiment.

Referring to FIG. 14, a circuit board 100B according to the present embodiment is similar to the circuit board according to the embodiment described with reference to FIG. 1 and FIG. 2. A detailed description of the same constituent elements is omitted.

Referring to FIG. 14, unlike the circuit board according to the embodiment described with reference to FIG. 1, in a circuit board 100B according to the present embodiment, a contact pad CTP may have a quadrangular planar shape, and a solder resist SR may have a quadrangular loop shape. In addition, unlike the manufacturing method of the circuit board according to the embodiment described with reference to FIG. 3 to FIG. 11, the contact pad CTP may be formed to correspond to the first connecting layer portion CLP1 in the contact layer CTL and have a quadrangular planar shape. In addition, a solder resist SR may be formed to surround the contact pad CTP on a first solder resist layer SL1 and have a quadrangular loop shape.

Referring to FIG. 15, a circuit board 100C according to the present embodiment is similar to the circuit board according to the embodiment described with reference to FIG. 1 and FIG. 2. A detailed description of the same constituent elements is omitted.

Referring to FIG. 15, unlike the circuit board according to the embodiment described with reference to FIG. 1, the circuit board 100C according to the present embodiment may not include a first solder resist layer SL1. Accordingly, the contact pad CTP partially overlaps a first portion IL1$a$ of the first insulating layer IL1 and may be exposed to the outside.

Referring to FIG. 16, a circuit board 100D according to the present embodiment is similar to the circuit board according to the embodiment described with reference to FIG. 1 and FIG. 2. A detailed description of the same constituent elements is omitted.

Referring to FIG. 16, unlike the circuit board according to the embodiment described with reference to FIG. 1, the circuit board 100D according to the present embodiment may not include a first solder resist layer SL1, and a contact pad CTP may have a quadrangular planar shape. Accordingly, the contact pad CTP partially overlaps a first portion IL1$a$ of a first insulating layer IL1 and may be exposed to the outside.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A circuit board comprising:

an insulating layer;

a contact layer protruding from a first surface of the insulating layer;

a connecting layer that includes a connecting portion embedded in the insulating layer and disposed on the contact layer;

a via layer that penetrates the insulating layer and is connected to the connecting layer; and a wiring layer that is disposed on a second surface of the insulating layer opposing the first surface and connected to the via layer, wherein the connecting portion includes a first connecting layer portion disposed on the contact layer and a second connecting layer portion disposed on the first connecting layer portion, the insulating layer includes a first portion disposed to embed the first connecting layer portion and surround the first connecting layer portion and a second portion to embed the second connecting layer portion, the insulating layer includes a cavity penetrating the second portion, the first portion has a smaller area than the second portion, the first connecting layer portion is disposed between the second connecting layer portion and the contact layer, and the connecting portion is disposed between the contact layer and the via layer.

2. The circuit board of claim 1, wherein in a plan view of the circuit board, the second connecting layer portion has an area different from an area of the first connecting layer portion.

3. The circuit board of claim 1, wherein the connecting layer includes a plurality of the connecting portions and the insulating layer includes a plurality of the first portions.

4. The circuit board of claim 3, wherein
the first portions are spaced apart from each other and disposed independently.

5. The circuit board of claim 1, wherein
the contact layer comprises a contact pad corresponding to the connecting portion.

6. The circuit board of claim 5, wherein
in a plan view of the circuit board, the contact pad has an area larger than that of the first connecting layer portion.

7. The circuit board of claim 5, further comprising a solder resist layer including a solder resist disposed to surround the contact pad on the first surface of the insulating layer.

8. The circuit board of claim 7, wherein
the contact pad has a circular or quadrangular shape in a plan view of the circuit board.

9. The circuit board of claim 8, wherein
the solder resist has a circular or quadrangular loop shape.

10. The circuit board of claim 1, wherein
the second connecting layer portion contains a metal.

11. The circuit board of claim 1, wherein
the via layer is tapered in a direction towards the connecting layer.

12. An electronic component package comprising:
a first circuit board;
a second circuit board connected to the first circuit board; and
an electronic component mounted on one surface of the second circuit board,
wherein the first circuit board comprises:
an insulating layer;
a contact layer protruding from a first surface of the insulating layer;
a connecting layer that includes a connecting portion embedded in the insulating layer and disposed on the contact layer;
a via layer that penetrates the insulating layer and is connected to the connecting layer; and
a wiring layer that is disposed on a second surface of the insulating layer opposing the first surface and connected to the via layer,
wherein the connecting portion includes a first connecting layer portion disposed on the contact layer and a second connecting layer portion disposed on the first connecting layer portion,
the insulating layer includes a first portion disposed to embed the first connecting layer portion and surround the first connecting layer portion and a second portion to embed the second connecting layer portion,
the insulating layer includes a cavity penetrating the second portion,
the first portion has a smaller area than the second portion,
the first connecting layer portion is disposed between the second connecting layer portion, and
the connecting portion is disposed between the contact layer and the via layer.

13. The electronic component package of claim 12, wherein
the connecting layer comprises a plurality of the connecting portions and the insulating layer includes a plurality of the first portions, and
the first portions are spaced apart from each other and disposed independently.

14. The electronic component package of claim 12, further comprising an encapsulant that is disposed between the first circuit board and the second circuit board and covers at least a part of the electronic component,
wherein the encapsulant is disposed in at least a part of the cavity.

15. The electronic component package of claim 12, wherein
the contact layer includes a contact pad corresponding to the connecting portion.

16. The electronic component package of claim 15, wherein
the contact pad has a circular or quadrangular shape in a plan view of the electronic component package.

* * * * *